(12) United States Patent
Segi et al.

(10) Patent No.: US 6,753,603 B2
(45) Date of Patent: Jun. 22, 2004

(54) ELECTRONIC EQUIPMENT HAVING INSULATING HEAT DISSIPATION PLATE

(75) Inventors: Hiroshi Segi, Mie (JP); Toshiyuki Taniguchi, Mie (JP); Takaharu Murakami, Mie (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 18 days.

(21) Appl. No.: 10/130,210

(22) PCT Filed: Sep. 17, 2001

(86) PCT No.: PCT/JP01/08053
§ 371 (c)(1),
(2), (4) Date: Aug. 20, 2002

(87) PCT Pub. No.: WO02/25731
PCT Pub. Date: Mar. 28, 2002

(65) Prior Publication Data
US 2003/0057885 A1 Mar. 27, 2003

(30) Foreign Application Priority Data
Sep. 19, 2000 (JP) .......................................... 2000-283018
Aug. 9, 2001 (JP) .......................................... 2001-242874

(51) Int. Cl.[7] .............................................. H01L 23/34
(52) U.S. Cl. ........................ 257/718; 257/717; 257/719; 257/722
(58) Field of Search ................................. 257/718, 717, 257/719, 722

(56) References Cited

U.S. PATENT DOCUMENTS

| 5,705,854 | A | * | 1/1998 | Atarashi et al. ............. 257/721 |
| 5,796,584 | A | * | 8/1998 | Myrberg ..................... 361/707 |
| 6,351,031 | B1 | * | 2/2002 | Iijima et al. ................ 257/698 |

FOREIGN PATENT DOCUMENTS

| JP | 58-116235 | 8/1983 |
| JP | 6-21589 | 1/1994 |
| JP | 6-275668 | 9/1994 |
| JP | 10-205861 | 8/1998 |
| JP | 10-290086 | 10/1998 |

* cited by examiner

Primary Examiner—David Nelms
Assistant Examiner—Tu-Tu Ho
(74) Attorney, Agent, or Firm—Wenderoth, Lind & Ponack, L.L.P.

(57) ABSTRACT

Electronic equipment comprises a wiring board, an electronic component mounted on the wiring board and having a heat dissipation portion on a surface thereof, and an insulating heat dissipation plate thermally connected to the electronic component, wherein the heat dissipation portion is directly connected to the heat dissipation plate via a heat conductive bonding material that includes metal. The heat dissipation plate is a ceramic plate having at least one land for connecting the electronic component thereto, or a resin plate containing highly heat conductive material. By directly connecting the insulating heat dissipation plate to an electronic component generating heat, an insulating plate between the heat dissipation plate and the electronic component is not required.

22 Claims, 6 Drawing Sheets

ELECTRONIC EQUIPMENT HAVING INSULATING HEAT DISSIPATION PLATE

This application is a 371 of International Application No. PCT/JP01/08053, filed Sep. 17, 2001.

TECHNICAL FIELD

The present invention relates to electronic equipment having heat generating electronic components mounted to a substrate.

BACKGROUND ART

Conventional electronic equipment having heat generating electronic components mounted to a substrate is structurally as follows. The conventional electronic equipment includes a wiring board and electronic components mounted on the wiring board. Of the electronic components, a metallic plate is thermally connected to those generating heat, and heat from these electronic components is radiated via the metallic plate.

The above conventional electronic equipment involves such a problem in that an effect of heat dissipation from electronic components is insufficient. That is, in the conventional electronic equipment, as described above, an insulating plate made of resin or inorganic material is provided between the electronic components and the metallic plate, and the insulating plate causes a heat dissipation effect to become insufficient.

The present invention is intended to provide a method of mounting electronic components, which allows for improved heat dissipation from heat generating electronic components, and also to provide electronic equipment using the electronic components.

SUMMARY OF THE INVENTION

Electronic equipment of the present invention comprises a wiring board, an electronic component mounted on the wiring board and having a heat dissipation portion on a surface thereof, and an insulating heat dissipation plate thermally bonded to the electronic component, wherein the heat dissipation portion is directly connected to the heat dissipation plate via a heat conductive bonding material that includes metal. The heat dissipation plate for electronic equipment of the present invention is a ceramic plate having at least one land for connecting the electronic component thereto, or a resin plate including highly heat conductive material.

By directly connecting an insulating heat dissipation plate to a heat generating electronic component, it becomes unnecessary to dispose an insulating plate, as provided in the conventional electronic equipment, between the heat dissipation plate and electronic component. As a result, an effect of heat dissipation from electronic components in electronic equipment may be enhanced.

DETAILED DESCRIPTION OF PREFERRED EMBODIMENTS

The preferred embodiments of the present invention will be described in the following with reference to the drawings.

First Preferred Embodiment

Figure 1:
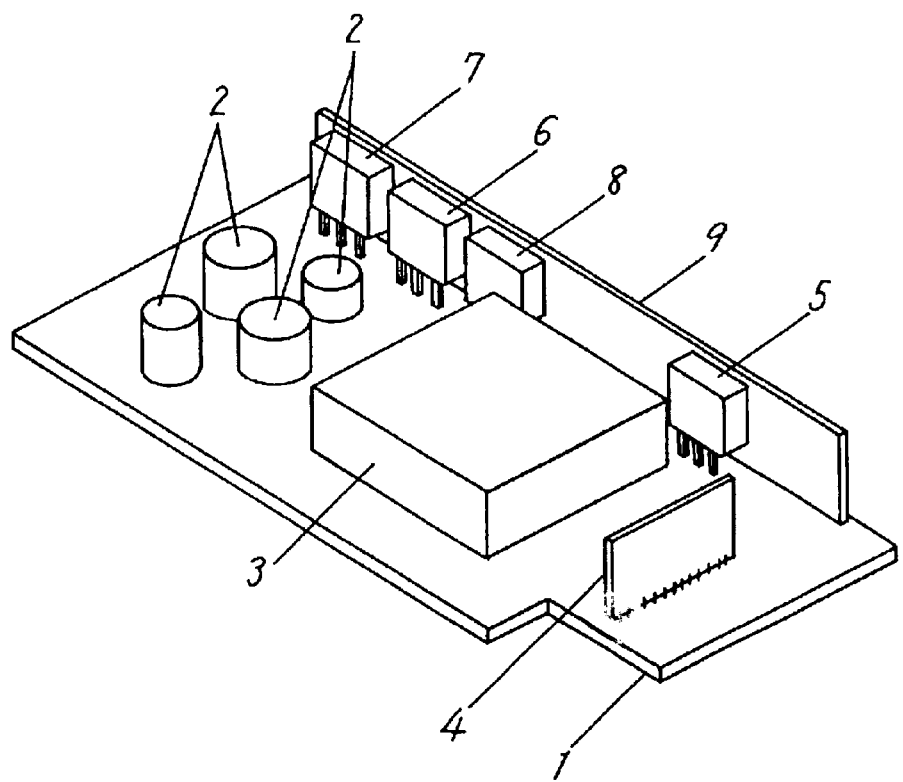
FIG. 1 is a perspective view of an electronic equipment unit in a first preferred embodiment of the present invention.

In FIG. 1, on a top surface of wiring board 1 is mounted electronic components such as electrolytic capacitors 2, transformer 3, wiring module 4, FETs 5, 6, 7, and diode 8, thereby forming an electronic equipment unit.

As described above, a plurality of electronic components are mounted on the wiring board 1. Particularly, FETs 5, 6, 7 and diode 8 exhibit considerable heat generation when power is applied thereto.

In this preferred embodiment, these electronic components are soldered to ceramic plate 9 as one of heat dissipation plates. In the present preferred embodiment, solder is used as an example of a heat conductive bonding material that includes metal.

Essential points of the present invention will be further described in detail with reference to FIG. 2.

Figure 2:
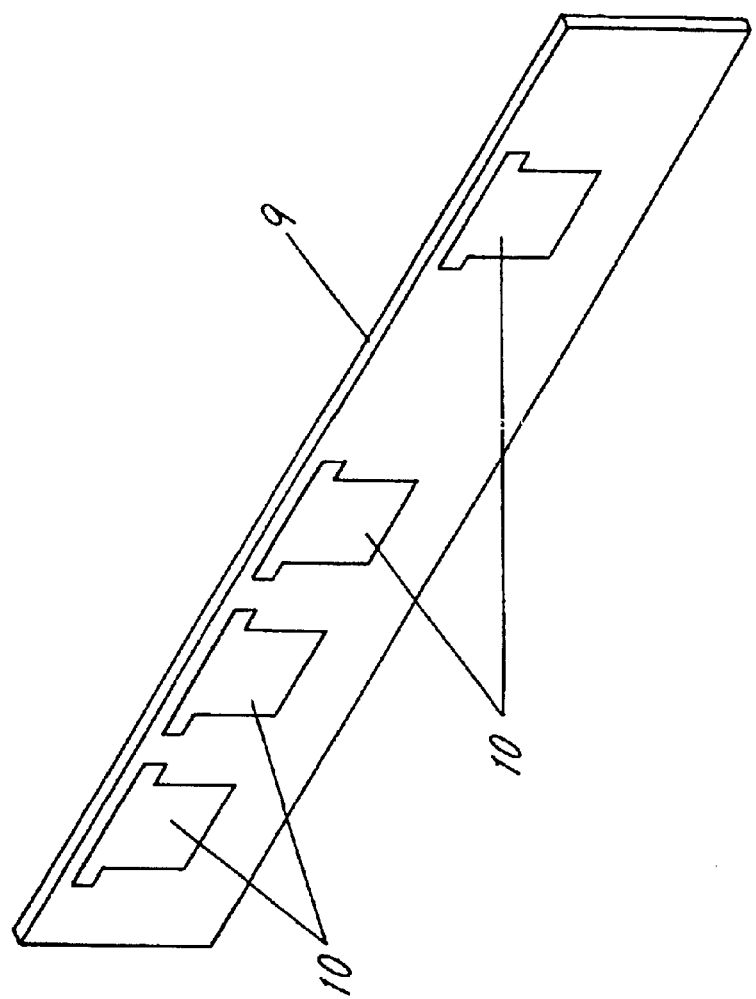
FIG. 2 is an exploded perspective view showing states of a ceramic plate and FETs in the present invention.
Figure 2:
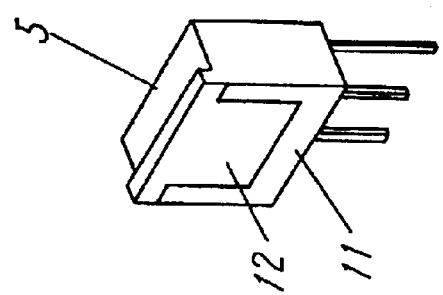

As shown in FIG. 2, ceramic plate 9 is provided with soldering lands 10 spaced a predetermined distance from each other. On the other hand, referring to the individual electronic components mentioned above, a periphery of FET 5, for example, is covered with mold resin 11, except that heat dissipation portion 12 is exposed at a back side as shown in FIG. 2. Here, the heat dissipation portion 12 and land 10 are same in shape as shown in FIG. 2. Further, in the present preferred embodiment, the heat dissipation portion 12 and land 10 are T-shaped in that an upper portion is broader than a lower portion.

And, the heat dissipation portion 12 and land 10 are bonded to each other by soldering, and in this case, since the land 10 and heat dissipation portion 12 are T-shaped, deflection between FET 5 and land 10 during soldering will be lessened due to self-alignment effects.

Various ceramic metallizing techniques generally employed for ceramic parts may be used for forming the land 10. As metallizing techniques, there are many methods and processes such as a high-temperature firing conductive paste method, wet plating process, vacuum deposition process, sputtering method, CVD method, and metal spraying method. Any kind of metallic material can be selected as land forming material according to a bonding material used.

Figure 3:
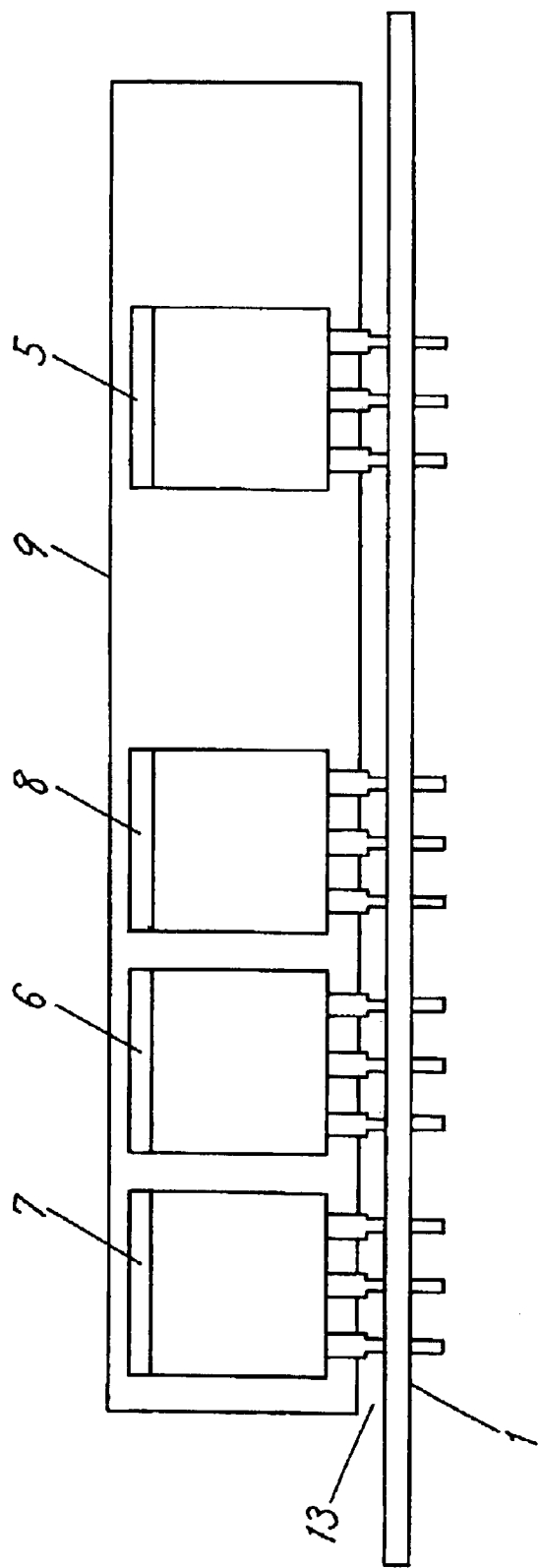
FIG. 3 is a front view showing a ceramic plate and wiring board in the present invention.

Also, by providing a plurality of lands 10 spaced a predetermined distance from each other on the ceramic plate 9, and soldering heat dissipation portions 12 of electronic components to the lands 10 as shown in FIG. 1, a plurality of electronic components can be easily thermally bonded to the ceramic plate 9 as shown in FIG. 3.

In the electronic equipment of the present preferred embodiment, a clearance 13 is formed between a bottom end of the ceramic plate 9 and the top surface of the wiring board 1.

That is, the ceramic plate 9 is held by electronic components and mounted on the board, with the clearance 13 between a bottom of the ceramic plate and the wiring board. In this way, air may flow through the clearance 13, thereby improving ventilation and enhancing a heat dissipation effect.

In this preferred embodiment, solder is used as a heat conductive bonding material, but the bonding material is not limited to solder. It is possible to use any type of highly heat conductive material that includes metal and may bond an electronic component to the wiring board. As examples of other materials, alloys containing tin, indium or bismuth, and conductive adhesives containing a large quantity of silver, copper or the like can also be used.

Second Preferred Embodiment

Figure 4:
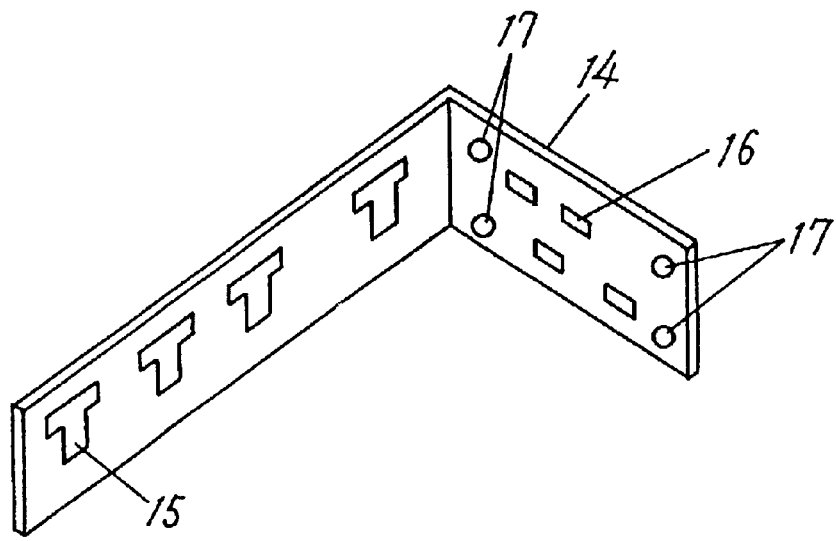
FIG. 4 is a perspective view of a heat dissipation plate in a second preferred embodiment of the present invention.

FIG. 4 shows an example of a heat dissipation plate for electronic components in a second preferred embodiment of the present invention. In this preferred embodiment, there is provided a resin plate 14, including highly heat conductive material such as ceramic fillers or the like as a heat dissipation plate, in place of the ceramic plate 9 used in the first preferred embodiment. The resin plate 14 is provided with a plurality of soldering lands 15 spaced a predetermined distance from each other, and heat dissipation portions 12 of electronic components 5 shown in FIG. 2 are soldered to each land 15.

Since the resin plate 14 can be more easily molded than the ceramic plate 9, an end portion thereof is bent 90° to provide lands 16 for mounting other electronic component as shown in FIG. 4.

Also, vent holes 17 are made in the resin plate 14, and air flowing through the vent holes 17 may enhance a heat dissipation effect.

Figure 5:
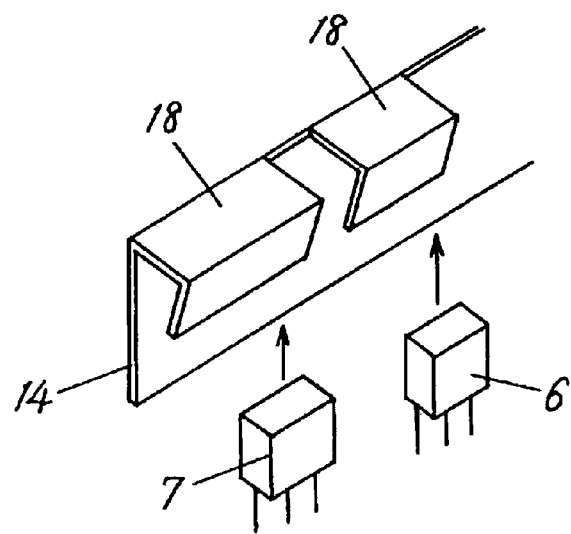
FIG. 5 is a perspective view of another heat dissipation plate in the second preferred embodiment of the present invention.
Figure 6:
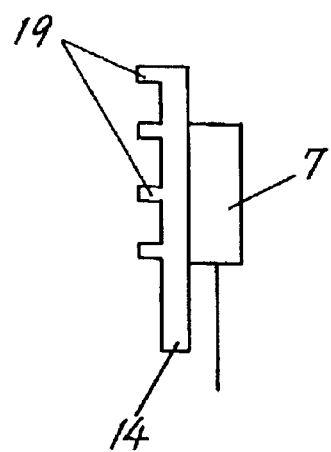
FIG. 6 is a side view of still another heat dissipation plate in the second preferred embodiment of the present invention.
Figure 7:
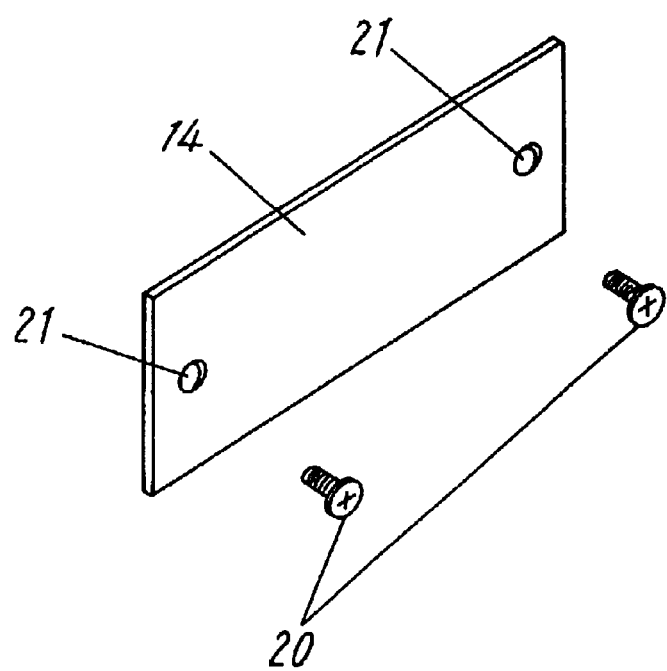
FIG. 7 is a perspective view of yet another heat dissipation plate in the second preferred embodiment of the present invention.

Since the resin plate 14 has excellent processability, it is possible to integrally form holding portions 18 to hold electronic components on the resin plate 14 as shown in FIG. 5, to integrally form heat dissipation fin 19 as shown in FIG. 6, and to make screw holes 21 for electronic component screws 20 as shown in FIG. 7.

Third Preferred Embodiment

Figure 8:
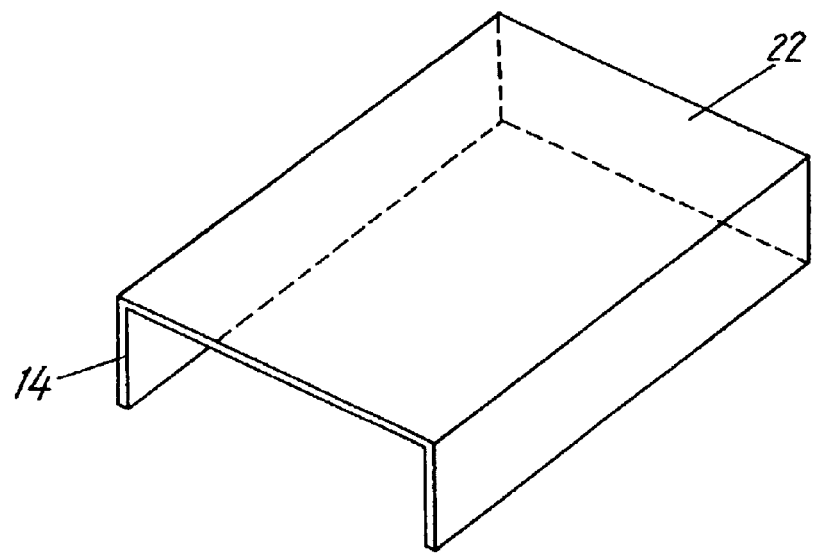
FIG. 8 is a perspective view of an electronic equipment cover in a third preferred embodiment of the present invention.

An electronic equipment cover in a third preferred embodiment of the present invention will be described with reference to FIG. 8.

In this preferred embodiment, resin plate portion 14 and electronic equipment cover portion 22 are integrally molded. Accordingly, a heat dissipation area can be increased, and since the resin plate portion faces an outermost portion of equipment, a heat dissipation effect will be enhanced.

As for integral molding, it is preferable to form the cover portion 22 and plate portion 14 from a single resin with highly heat conductive material mixed therein. As another method of molding, it is possible to form the resin plate portion 14 from one resin with highly heat conductive material mixed therein, and the cover portion 22 from another molding resin; that is, to employ what is called a two-color molding method.

In the electronic equipment of the present preferred embodiment, connectors may be provided on the wiring board for connecting heat generating components previously bonded to the cover, or to connect lead wires from heat generating components to another wiring board.

Further, it is possible to form wiring patterns on an inner surface of the resin plate portion 14, and to mount all components on the resin plate portion 14 as surface-mounting components, thereby making it unnecessary to use a wiring board.

INDUSTRIAL APPLICABILITY

As described above, electronic equipment of the present invention comprises a wiring board, electronic components mounted on the wiring board, and an insulating heat dissipation plate thermally bonded to the electronic components, wherein the electronic components each have a heat dissipation portion on a surface thereof, and each electronic component is bonded to a heat dissipation plate portion by using heat conductive bonding materials that includes metal. According to the present invention, it is unnecessary to dispose an insulating plate, for thermal resistance, between the electronic components and the heat dissipation plate, and thus it becomes possible to greatly enhance a heat dissipation effect of heat generated from the electronic components.

What is claimed is:

1. Electronic equipment comprising:
    a wiring board;
    an electronic component mounted on said wiring board and having a heat dissipation portion on a surface of said electronic component; and
    an insulating heat dissipation plate thermally connected to said electronic component,
    wherein said heat dissipation portion is directly connected to said insulating heat dissipation plate via heat conductive bonding material that includes metal.

2. The electronic equipment according to claim 1, wherein said insulating heat dissipation plate comprises a ceramic plate having a land to which said heat dissipation portion of said electronic component is connected via said heat conductive bonding material.

3. The electronic equipment according to claim 1, wherein said insulating heat dissipation plate is disposed on said wiring board with a predetermined space between a bottom of said insulating heat dissipation plate and a top of said wiring board.

4. The electronic equipment according to claim 1, wherein said insulating heat dissipation plate comprises a resin plate containing a highly heat conductive material and having a land to which said heat dissipation portion of said electronic component is connected via said heat conductive bonding material.

5. The electronic equipment according to claim 4, wherein said insulating heat dissipation plate is disposed on said wiring board with a predetermined space between a bottom of said insulating heat dissipation plate and a top of said wiring board.

6. The electronic equipment according to claim 4, wherein said insulating heat dissipation plate has an additional land to which a heat dissipation portion of another electronic component is to be connected.

7. The electronic equipment according to claim 4, wherein said insulating heat dissipation plate has a holding portion for holding said electronic component.

8. The electronic equipment according to claim 4, wherein said insulating heat dissipation plate has a heat dissipation fin portion integral therewith.

9. The electronic equipment according to claim 4, wherein said insulating heat dissipation plate has a vent hole.

10. The electronic equipment according to claim 4, wherein said insulating heat dissipation plate has a screw hole.

11. The electronic equipment according to claim 4, wherein said insulating heat dissipation plate is unitary with an electronic equipment cover.

12. The electronic equipment according to claim 1, wherein
    said heat conductive bonding material is one of solder, an alloy containing one of tin, indium and bismuth, and a conductive adhesive containing silver particles or copper particles.

13. The electronic equipment according to claim 12, wherein said insulating heat dissipation plate comprises a ceramic plate having a land to which said heat dissipation portion of said electronic component is connected via said heat conductive bonding material.

14. The electronic equipment according to claim 12, wherein said insulating heat dissipation plate is disposed on said wiring board with a predetermined space between a bottom of said insulating heat dissipation plate and a top of said wiring board.

15. The electronic equipment according to claim 12, wherein said insulating heat dissipation plate comprises a resin plate containing a highly heat conductive material and having a land to which said heat dissipation portion of said electronic component is connected via said heat conductive bonding material.

16. The electronic equipment according to claim 15, wherein said insulating heat dissipation plate is disposed on said wiring board with a predetermined space between a bottom of said insulating heat dissipation plate and a top of said wiring board.

17. The electronic equipment according to claim 15, wherein said insulating heat dissipation plate has an additional land to which a heat dissipation portion of another electronic component is to be connected.

18. The electronic equipment according to claim 15, wherein said insulating heat dissipation plate has a holding portion for holding said electronic component.

19. The electronic equipment according to claim 15, wherein said insulating heat dissipation plate has a heat dissipation fin portion integral therewith.

20. The electronic equipment according to claim 15, wherein said insulating heat dissipation plate has a vent hole.

21. The electronic equipment according to claim 15, wherein said insulating heat dissipation plate has a screw hole.

22. The electronic equipment according to claim 15, wherein said insulating heat dissipation plate is unitary with an electronic equipment cover.

* * * * *